United States Patent
Suga et al.

(10) Patent No.: US 12,275,670 B2
(45) Date of Patent: Apr. 15, 2025

(54) METHOD FOR JOINING TRANSPARENT SUBSTRATES

(71) Applicants: iSABers Japan Co. Ltd., Tokyo (JP); Tadatomo Suga, Tokyo (JP)

(72) Inventors: Tadatomo Suga, Tokyo (JP); Yoshiie Matsumoto, Tokyo (JP)

(73) Assignees: Tadatomo SUGA, Tokyo (JP); iSABers Japan Co. Ltd., Tokyo (JP)

( * ) Notice: Subject to any disclaimer, the term of this patent is extended or adjusted under 35 U.S.C. 154(b) by 488 days.

(21) Appl. No.: 17/296,490

(22) PCT Filed: Nov. 25, 2019

(86) PCT No.: PCT/JP2019/046041
§ 371 (c)(1),
(2) Date: Dec. 20, 2021

(87) PCT Pub. No.: WO2020/111015
PCT Pub. Date: Jun. 4, 2020

(65) Prior Publication Data
US 2022/0332637 A1    Oct. 20, 2022

(30) Foreign Application Priority Data
Nov. 26, 2018    (JP) .................... 2018-219838

(51) Int. Cl.
*C03C 27/04*    (2006.01)
*B32B 17/06*    (2006.01)
(Continued)

(52) U.S. Cl.
CPC ............ *C03C 27/042* (2013.01); *B32B 17/06* (2013.01); *C03C 17/245* (2013.01); *C03C 27/10* (2013.01);
(Continued)

(58) Field of Classification Search
None
See application file for complete search history.

(56) References Cited

U.S. PATENT DOCUMENTS 4,790,920 A * 12/1988 Krzanich .......... H01L 21/31616
257/E21.28
9,725,357 B2 * 8/2017 Adib ....................... B32B 17/10
(Continued)

FOREIGN PATENT DOCUMENTS

| CN | 103460339 A | 12/2013 |
| EP | 19 88 8990 A1 | 7/2022 |

(Continued)

OTHER PUBLICATIONS

International Search Report for Application No. PCT/JP2019/046041 mailed Feb. 18, 2020.

*Primary Examiner* — Barbara J Musser
(74) *Attorney, Agent, or Firm* — McBee, Moore & Vanik IP, LLC

(57) ABSTRACT

A method of bonding transparent substrates is provided, comprising: preparing a pair of transparent substrates; forming a thin film of aluminum oxide by a sputtering method, on a bonding surface of the transparent substrates; contacting the aluminum oxide thin films in the air to bond the pair of transparent substrates; and heating the bonded pair of transparent substrates.

18 Claims, 4 Drawing Sheets

(51) Int. Cl.
  *C03C 17/245* (2006.01)
  *C03C 27/10* (2006.01)
  *C23C 14/08* (2006.01)
  *C23C 14/46* (2006.01)
  *C23C 14/58* (2006.01)
  *H10K 71/50* (2023.01)
(52) U.S. Cl.
  CPC ............ *C23C 14/081* (2013.01); *C23C 14/46* (2013.01); *C23C 14/5833* (2013.01); *H10K 71/50* (2023.02); *C03C 2217/214* (2013.01); *C03C 2218/154* (2013.01)

(56) References Cited

U.S. PATENT DOCUMENTS

| | | |
|---|---|---|
| 2012/0161305 A1 | 6/2012 | Ruben et al. |
| 2013/0213561 A1 | 8/2013 | Utsumi et al. |
| 2014/0037945 A1 | 2/2014 | Suga et al. |
| 2015/0367598 A1 | 12/2015 | Ruben et al. |

FOREIGN PATENT DOCUMENTS

| | | |
|---|---|---|
| JP | H7-246342 A | 9/1995 |
| JP | 2004-327402 A | 11/2004 |
| JP | 2008-207221 A | 9/2008 |
| JP | 2014-123514 A | 7/2014 |
| JP | 2014123514 A1 | 7/2014 |
| JP | 2015-141738 A | 8/2015 |
| JP | 2017188204 A1 | 10/2017 |
| JP | 2018219838 A1 | 10/2022 |
| WO | 2015/125770 A1 | 8/2015 |
| WO | 2015/146305 A1 | 10/2015 |
| WO | 2019/131490 A1 | 7/2019 |

\* cited by examiner (a)

(b)

(c)

(a)

(b)

(c)

METHOD FOR JOINING TRANSPARENT SUBSTRATES

CROSS-REFERENCE TO RELATED APPLICATIONS

This application is the National Stage entry of International Application No. PCT/JP2019/046041, filed 25 Nov. 2019, which claims priority to Japanese No. 2018-219838, filed 26 Nov. 2018.

TECHNICAL FIELD

The present disclosure relates to a method of bonding substrates. More particularly, the present invention relates to a method of forming a laminate body of transparent substrates so as to substantially enjoy the light transmittance of the laminated substrates themselves.

BACKGROUND ART

In the development of optical devices and communication devices, etc., it has become important to take out the light from the light emitting element to the outside efficiently through transparent substrates.

SUMMARY OF INVENTION

In the present disclosure, a method of bonding transparent substrates is provided, comprising:
preparing a pair of transparent substrates;
forming a thin film of aluminum oxide by a sputtering method on bonding surfaces of the transparent substrates;
contacting the thin film of aluminum oxide in the air, to bond the pair of transparent substrates; and
heating the bonded pair of transparent substrates.

DESCRIPTION OF EMBODIMENTS

Figure 1:
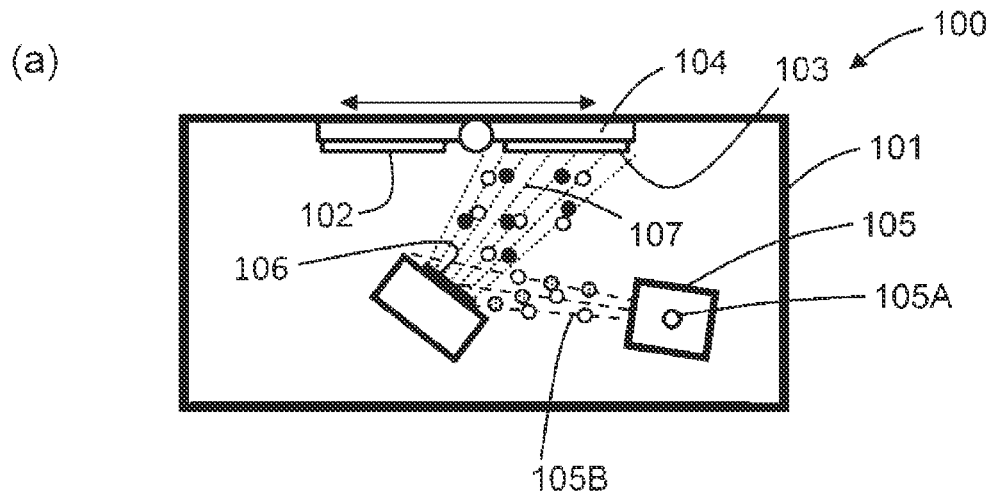
FIG. 1 shows each step of the forming method of the laminate body according to one embodiment, together with the apparatus configuration.
Figure 1:
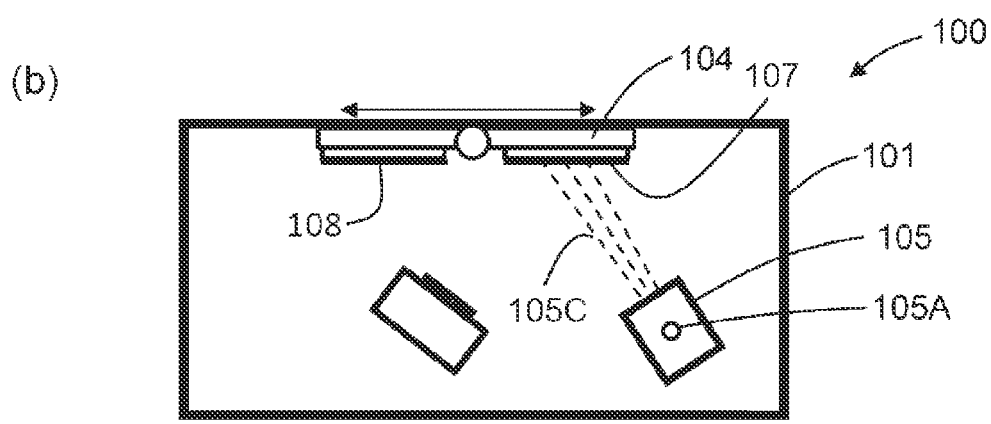
Figure 1:
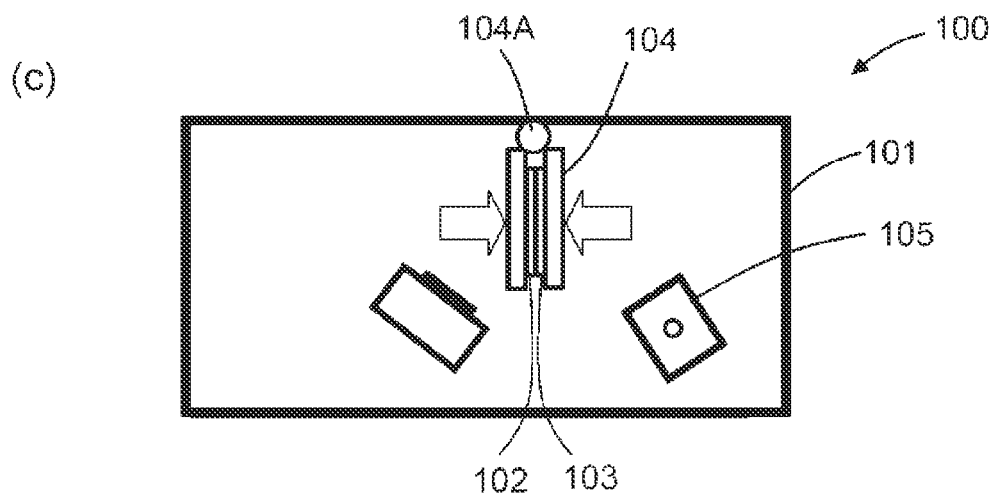

As an example of a device using a transparent substrate, an optoelectronic device represented by displays (display elements) often has the configuration that a light emitting element is bonded to the glass as an extraction component of the light. Here, generally, both are bonded via an adhesive film. As an example, which does not limit the present disclosure, an organic electroluminescence (hereinafter also referred to as "organic EL") device is formed by attaching an organic EL element covered with a polymer to a protective glass. Also, in the flexible organic EL, the organic EL element is covered with a polymer, and the polarizing plate or the like is also made of a polymer.

However, there is no technique for directly boning a polymer substrate or a polymer film to a protective glass having a function of protecting a device such as an organic EL element. Therefore, via an optically clear adhesive sheet (hereinafter also referred to as "OCA"), the device and the protective glass are indirectly bonded to each other. Here, a component called OCA is a cost factor. Also, products using OCA are not suitable for applications in situations where organic matter cannot be used, such as under radiation.

In addition to the field of displays (display elements), there are many demands to bond glass together without compromising the light transmittance. Usually, an adhesive formed of an organic material is used to form glass with each other. However, adhesives have been regarded as one of the causes of lowering the light transmittance. Further, since an organic material is formed as an adhesive by application, bubbles are easily generated at the bonding interface, which affects the quality of the bonding interface.

On the other hand, in the method of bonding substrates included in the present disclosure, aluminum oxide is transparent to visible light, and aluminum oxide formed by, for example, a sputtering method or the like has a relatively strong bonding strength. Therefore, it has both permeability and bondability.

<Substrates to be Bonded>

A "transparent substrate" refers to a substrate having a high transmittance of light including visible light. For example, the visible light transmittance may be 90% or higher. The "transparent substrate" may be a substrate containing as a base material or including glass including $SiO_2$, tempered glass, polymer, or the like. While the methods of bonding substrates included in the present disclosure have numerous advantages, one advantage is that substrates including $SiO_2$, which previously could not be bonded without compromising or significantly degrading transparency, can also be bonded while maintaining a high optical transmittance.

One or both of the substrates bonded to the transparent substrate may be a transparent substrate. The substrates to be bonded may be a pair of substrates, a pair of transparent substrates, one of which may be a transparent substrate and the other of which may be a translucent or opaque substrate.

Both of the pair of substrates to be bonded may be glass substrates or polymer substrates. One of the pair of substrates to be bonded may be a glass substrate and the other may be a polymer substrate. The polymer substrate may be a substrate substantially consisting of a polymer material. The bonding surface of at least one of the substrates to be bonded may substantially consist of a polymer material.

The method of bonding substrates may include providing a substrate used for bonding or a transparent substrate and another substrate, and may include providing a pair of substrates at least one of which is a transparent substrate.

One or both of the substrates to be bonded may be a substrate mainly consisting of a polymer material, or a polymer substrate. The polymer material substrate may be a plastic substrate or a flexible substrate. The polymer material may be PEN (polyethylene naphthalate), PET (polyethylene terephthalate), other polyester materials, PI (polyimide), COP (cycloolefin polymer), PC (polycarbonate), and is not limited thereto, and may be any other polymer or plastic material. The substrate may include a POL (polarizing filter). The substrate may substantially consist of a polymer material, and may comprise a polymer material, and may be made of a polymer material and other materials or members. The polymer substrate may be a transparent substrate.

The substrates to be bonded may be circular or rectangular, and may be in the form of a tape.

One of the substrates to be bonded may include an optical element. The optical element may be or include a light emitting element, a light receiving element, and may include other optical, optoelectronic, or electronic elements, circuits, and materials. The substrate to be bonded may include a layer of an optical element, and may include a layer of an optical element and a layer of a polymer. For example, the substrate may be configured to include a layer including an optical element or an optical element layer, and a layer including a polymer material or a polymer layer.

One of the substrates to be bonded may include an optical element layer including an optical element, and a polymer layer including a polymer material covering the optical element layer. The surface of the polymer layer may be a bonding surface.

In the final product, for example, when the optical element is a light emitting element, all substrates and layers through which light emitted from the light emitting element to the outside of the product passes are preferably transparent, for example, when the optical element is a light receiving element, all substrates and layers through which the light incident from the outside of the product reaches the light receiving element are preferably transparent. In the final product including an optical element, the term "transparent" means a transparency to such an extent that among the light emitted from the light-emitting element a practically sufficient amount of light is extracted to the outside or to such an extent that among the light incident from the outside a practically sufficient amount of light is detected by the light-receiving element.

On the other hand, it is preferable that the light transmittance of the transparent substrate laminate body formed after bonding (hereinafter referred to as "post-bonding light transmittance") has a sufficient light transmittance in the applications of the final product. For example, it is preferable that the post-bonding light transmittance is 90% or higher of the light transmittance for all of the plurality of substrates on which the substrates in the pre-bonding state are stacked as they are (hereinafter referred to as "pre-bonding light transmittance"). The post-bonding light transmittance may be 95% or higher of the pre-bonding light transmittance. The post-bonding light transmittance may be 97% or higher, 98% or higher, or 99% or higher of the pre-bonding light transmittance.

<Formation of an Aluminum Oxide Film>

Forming a thin film of aluminum oxide on the bonding surface of the substrate may be performed by a sputtering method, may be performed by a method or a process including a sputtering method. The sputtering method may be an ion beam sputtering method or an ion beam assisted sputtering method. It is considered that the metal oxide formed by the ion beam sputtering method has relatively low crystallinity, relatively many crystal defects, relatively many surfaces exposed at atomic bells, and so-called dangling bonds. Therefore, it is considered that the surface is in an activated state with relatively high activity, facilitating the bonding. However, this physical consideration is an inference, and the present disclosure is not limited to this mechanism.

In some embodiments, forming a thin film of aluminum oxide on the bonding surface of the substrate may be performed by an ion beam assisted sputtering method. The method may include forming aluminum oxide on a target substrate by a sputtering method in which metallic aluminum is used as a target and a mixed gas substantially composed of an inert gas and oxygen is used. In another embodiment, the sputtering process may be performed with metallic aluminum as a target and a mixed gas of substantially nitrogen gas and oxygen. By irradiating the metal target with a mixed gas and sputtering the metal aluminum, a mixture of aluminum and oxygen or an oxide of aluminum, aluminum oxide, can be formed on the bonding surface.

In another embodiment, forming a thin film of aluminum oxide on the bonding surface of the substrate may include using metallic aluminum as a target, sputtering it substantially by inert gas in the bonding surface direction, and feeding oxygen gas from another direction to the bonding surface.

The inert gas may be a rare gas. The rare gas may be any one of helium (He), neon (Ne), argon (Ar), krypton (Kr), xenon (Xe), and radon (Rn), and may be a plurality of mixed gases thereof. The inert gas may be in particular argon (Ar).

A thin film of aluminum oxide such as $Al_2O_3$ can be formed by sputtering an aluminum target using a mixed gas of a rare gas such argon and an oxygen gas.

The oxide of aluminum in the thin film may be a $Al_2O_3$ of stoichiometric composition, a non-stoichiometric composition, or a mixture thereof. In the metal oxide formed, the bonding form of aluminum and oxygen may be different from that of $Al_2O_3$ of the stoichiometric composition, and may include and different ones.

The gas mixture used for sputtering may be substantially consist of argon gas and oxygen gas. The flow rate of the oxygen gas included in the mixed gas may be substantially 3%, 4%, 5%, 6%, 7%, 8%, 9%, or 10%, or greater than or equal to any value thereof with respect to the flow rate or total flow rate of the mixed gas.

The mixed gas may include another argon gas, and may include a rare gas other than argon gas. When the mixed gas includes a gas different from argon gas, or when the sputtering characteristics are substantially different or remarkably different due to an influence of an apparatus or an environment, an appropriate flow rate of the oxygen gas may be selected. For example, if the sputtering rate of the rare gas is smaller than that in the case where only argon gas is used, the flow rate ratio of oxygen may be smaller than 5%, for example, 4% or 3% or smaller. Conversely, for example, if the sputtering rate of the rare gas is greater than that in the case where only argon gas is used, the flow rate ratio of oxygen may be greater than 5%, for example, 6% or 7% or greater.

The substrates to be bonded may be a glass substrate and a glass substrate, a glass substrate and a polymer material (polymer) substrate, or a polymer substrate and a polymer substrate. When bonding surfaces of glass and glass are bonded or bonding surfaces of a polymer and a polymer are bonded, an aluminum oxide film may be formed on either one or both of them. When bonding surfaces of glass and a polymer are bonded, when a metal oxide film is formed on either one of them, an aluminum oxide film may be formed on the polymer, and thereby the bonding strength can be improved in many cases.

The thickness of the aluminum oxide film to be formed may be about 0.1 nm to 10 nm, and may be a value of 0.1 nm, 0.2 nm, 0.3 nm, 0.4 nm, 0.5 nm, 1 nm, 2 nm, 3 nm, 4 nm, 5 nm, 6 nm, 7 nm, 8 nm, or 9 nm or greater. The thickness of the metal oxide film to be formed may be 10 nm or smaller, and may be a value of 9 nm, 8 nm, 7 nm, 6 nm, 5 nm, 4 nm, 3 nm, 2 nm, or 1 nm or smaller. The thickness of the aluminum oxide layer in the substrate laminate body formed by bonding may be about 0.1 nm to 20 nm.

The characteristics and the film formation condition of the aluminum oxide film may be confirmed or analyzed using a surface-analysis method such as Auger electron spectroscopy (AES, Auger Electron Spectroscopy), X-ray photoelectron spectroscopy (XPS, X-ray Photo Electron Spectroscopy), scanning electron microscopy (SEM), transmission electron microscopy (TEM), or the like.

<Bonding>

The bonding may include bringing the bonding surfaces of the substrates into contact with each other via a thin film of aluminum oxide. At the time of bonding, a force may be applied to the substrate from a surface opposite to the bonding surface of the substrate, or from another surface than the bonding surface. For example, a force in a direction perpendicular to the bonding surface may be applied from the outside of the substrate. In some embodiments, the pressurization may be performed by applying a force so as to be substantially uniform across the bonding surfaces in contact. In another embodiment, the pressurization may be performed at different timings relative to different faces of the contacted bonding surfaces in contact. The strength of the force during the pressurization may be constant over time or variable. The pressurization may be performed at different timings with respect to the respective portions of the bonding surface. The pressurization may be formed sequentially with respect to the bonding surface, by moving by sliding a pressurizing apparatus with respect to the substrates in contact. The pressurizing apparatus may have a roller-shaped pressurizing section.

In some embodiments, after the aluminum oxide layer is formed on the bonding surfaces on the substrates, the pair of substrates may be brought into contact or bonded to each other, without being subjected to an atmosphere under a vacuum or a low pressure, but in the air. The air may be under the same or different pressures as the ambient air. The air may have the same component as the ambient air and may have different components. The air may be an atmosphere from which partially or substantially all of the suspended particles, such as particles, from the ambient air.

The air may be an atmosphere in which the amount of moisture or vapor is controlled. The air may include moisture and may not substantially include it. The humidity of the air may be substantially greater than 0%, and may be a value of 5%, 10%, 20%, 30%, 40%, 50%, 60% or the like, or greater.

The amount of exposure to the air during the time from the formation of the aluminum oxide film until the bonding of the substrates may be a time of 1 minute, 2 minutes, 5 minutes, 10 minutes, 15 minutes, 20 minutes, 30 minutes, or the like, or longer, and may be a time of 1 day, 12 hours, 10 hours, 6 hours, 3 hours, 2 hours, 60 minutes, 45 minutes, 30 minutes, or the like, or shorter, under atmospheric pressure.

<Heat Treatment>

The method of bonding substrates included in the present disclosure may further include heating the laminate body after bonding. The temperature of the heating may be substantially or approximately equal to or lower than 80° C. (80 degrees Celsius, the same hereinafter), 100° C., 200° C., 250° C., 300° C., 350° C., 400 C° or the like. The heating temperature may be substantially or approximately 550° C., 500° C., 450° C., 400° C., 350° C., 300° C., 250° C., 200° C., or the like, or lower. The heating may be performed simultaneously on the entire substrate or on a portion-by-portion basis of the substrate.

The heating time may be substantially or approximately 5 minutes, 10 minutes, 15 minutes, 30 minutes, 45 minutes, 1 hour, 2 hours, 3 hours, 4 hours, 5 hours, 6 hours, 8 hours, 10 hours, 12 hours, 15 hours, 18 hours, 20 hours, 24 hours, 36 hours, 48 hours, 72 hours, or the like, or longer. The heating time may be substantially or approximately 96 hours, 72 hours, 48 hours, 36 hours, 24 hours, 20 hours, 18 hours, 15 hours, 12 hours, 10 hours, 8 hours, 6 hours, 5 hours, 4 hours, 3 hours, 2 hours, or the like, or longer.

The atmosphere of the heat treatment may be ambient air, a nitrogen atmosphere, or a rare gas atmosphere.

<Substrate Surface Activation Treatment Before Film Formation>

In some embodiments, the method may further include irradiating the bonding surface of the substrate with energy particles prior to the formation of an aluminum oxide film. By the irradiation of the energy particles, the bonding surface of the substrate is activated and thereby the bonding strength between the bonding surface and the thin film formed thereon can be increased.

<Surface Activation Treatment after Film Formation>

In some embodiments, a surface activation process may be performed on the surface of the formed aluminum oxide film. In some embodiments, after the surface activation treatment, the bonding surface of the aluminum oxide film may be exposed to air and contacted and bonded after exposure.

In some embodiments, the substrates may be bonded together without performing a surface activation treatment after the formation of the aluminum oxide film.

The energetic particles may be generated by using a particle beam source, such as an ion beam source or a fast atom beam (FAB) source to accelerate ions or neutral atoms of gas particles or atoms used, or a mixture thereof. The irradiation of the energy particles may be performed using a plasma source.

A particle beam source can be used to give predetermined kinetic energy to the particles. A particle beam source operates in vacuo, for example at a pressure of $1 \times 10^{-5}$ Pa or less.

As a neutral atomic beam source, a fast atomic beam source (FAB, Fast Atom Beam) can be used. A fast atom beam source (FAB) typically generates a plasma of gas and applies an electric field to the plasma to extract positive ions of particles ionized from the plasma and pass them through an electron cloud for the neutralization. In this case, for example, in the case of argon (Ar) as a rare gas, the power supplied to the fast atom beam source (FAB) may be set to 1.5 kV (kilovolts), 15 mA (milliamperes), and may be set to a value between 0.1 and 500 W (watts). For example, when a fast atom beam source (FAB) is operated at 100 W (watts) to 200 W (watts) and irradiated with a fast atom beam of argon (Ar) for about 2 minutes, the oxide, contaminants and the like (surface layer) on the surface to be bonded can be removed to expose a new surface.

As the ion beam source, a cold cathode type ion source can be used.

The ion beam source may be a line type and cold-cathode type ion beam source. A line type particle beam source is a particle beam source having a line-shaped (linear) or elongated particle beam emission aperture from which a particle beam can be emitted to a line-type (linear). The length of the emission aperture is preferably larger than the diameter of the substrate to which the particle beam is irradiated. If the substrate is not circular, the length of the emission aperture is preferably greater than the maximum dimension in the direction in which the emission aperture extends for the substrate to be moved relative to the particle beam source.

The particle beam emitted from the line-type particle beam source irradiates a linear region or elongated region on the substrate at a time during the surface activation treatment. Then, the substrate support is scanned in a direction perpendicular to the direction in which the emission aperture extends while emitting the particle beam from the line-type particle beam source toward the substrate. As a result, the irradiated area of the linear particle beam passes over all parts of the substrate. Once the line-type particle beam source has passed over the substrate, the entire substrate is substantially uniformly irradiated by the particle beam and surface activated.

The line type particle beam source is suitable for irradiating a surface of a substrate having a relatively large area with a particle beam relatively uniformly. The line type particle beam source can also irradiate the particle beam relatively uniformly corresponding to various shapes of the substrate.

The energy particles may be a mixed gas substantially consisting of a rare gas and an oxygen gas, and may be the same mixed gas and may include other gases. When an energy particle beam is irradiated using only a rare gas without including an oxygen gas, oxygen may be deficient in the metal in the vicinity of the surface of the metal oxide. At this time, the transmittance of light such as visible light may be lowered due to a relative increase in the amount of metal. This is presumably because it is absorbed in a region including a relatively large amount of this metal. Therefore, it is considered that the energy particle beam to irradiate with respect to the bonding surface can include oxygen, so that this oxygen is bonded to the metal oxide surface, thereby avoiding or reducing the deficiency of oxygen. Thus, it is believed that it is possible to obtain a sufficient light transmittance of a laminate body of bonded transparent substrates.

The energy particles may be a rare gas and may include a rare gas. The rare gas may be argon and another noble gas. The energy particles may be neutral atoms or ions, and further may be radical species, and yet further may be a group of particles of a mixture thereof.

"Surface activation" means a treatment or process performed on a surface that is not substantially bonded or bonded when contacted without such a treatment or the like, wherein the surfaces after such a treatment or the like are contacted with each other to obtain a desired or substantially effective bond. A laminate body formed by bonding substrates after the surface activation treatment may or may not be subjected to a heating as they are, a light treatment, or the like.

Depending on the operating conditions of each plasma or beam source, or the kinetic energy of the particles, the removal rate of the surface layer may vary. Therefore, it is necessary to adjust each condition including the treatment time of the surface activation treatment. For example, by using a surface analyzing method such as Auger electron spectroscopy (AES, Auger Electron Spectroscopy) or X-ray photoelectron spectroscopy (XPS, X-ray Photo Electron Spectroscopy), a time period after which the presence of oxygen or carbon included in the surface layer cannot be confirmed or a longer time period may be employed as the treatment time of the surface activation treatment.

Example 1

As an example of the present disclosure, glass substrates were bonded, and the light transmittance was evaluated.

A bonding apparatus 100 shown in FIG. 1A is configured to include a vacuum chamber 101, a substrate support 104 disposed inside the vacuum chamber 101 and movably supporting a first substrate 102 and a second substrate 103, a particle-beam source 105 as a surface-activation treatment means, a metal target 106 for forming a thin film of a metal oxide, and a substrate support 104 as a bonding means having a rotating shaft 104A and a pressurizing means (not shown).

As shown in FIG. 1(a), a vacuum pump (not shown) is connected to the vacuum chamber 101, and the vacuum degree in the vacuum chamber 101 can be maintained at a pressure of $1\times10^{-5}$ Pa or less. The vacuum chamber 101 is provided with a vent valve (not shown) and can introduce ambient air into the vacuum chamber 101. The particle beam source 105 is rotatable about the rotational axis 105A, may sputter the metallic material by accelerating the particle group (107) of a mixed gas of argon and oxygen toward the sputtering target 106. The particle beam source 105 is configured to emit a particle beam 105B of particles having a predetermined kinetic energy toward the surface of the first substrate 102 or the second substrate 103 in accordance with the position of the substrate support 104 to perform the surface activation treatment of the substrate surface. When a metal oxide film is formed only in a predetermined region or a bonding region on the substrate, a mask defining the predetermined region is disposed on the substrate (not shown in the figure).

Also, while the thin film 107 is being deposited, the substrate support 104 may be scanned to provide a uniform deposition condition on the first substrate 102 or the second substrate 103. The thickness of the metal oxide layer may be stepwise controlled by the number of scans relative to the operating conditions of the predetermined particle beam source 105 and the predetermined placement positions within the vacuum chamber 101 of the particle beam source 105, the target 106, and the substrates 102,103.

In this embodiment, a glass substrate was used for both the first substrate 102 and the second substrate 103, and more particularly, an alkali-free glass (OA10-G manufactured by Nippon Electric Glass Co., Ltd.) of 80 mm square is used. Glass substrates 112,113 were introduced into the vacuum chamber 101, the atmosphere in the container was made to be a vacuum atmosphere of $10^{-5}$ Pa or less, which was maintained with the same evacuation capacity until the bonding was completed. Metallic aluminum was installed as the target 106, and a linear cold cathode type ion beam source was used as the particle beam source 105, and a mixed gas of argon gas and oxygen gas was supplied at a rate of 80 sccm under the condition of 1.2 kV and 400 mA. Thus, the target 106 was irradiated with the particle beam 105B of the mixed gas, and the particle group 107 including a mixture of aluminum and oxygen was sputtered toward the bonding surfaces of both the glass substrates. As a result, thin films of aluminum oxide 107,108 were formed on the bonding surfaces of the glass substrates 102,103 (FIG. 1(b)). The thickness was about 15 nm. The thickness of the aluminum oxide layer may be between 5 nm and 10 nm prior to bonding, and may be outside of this range. In one example, an aluminum oxide having a thickness of 7.5 nm may be formed on each substrate. In this case, the thickness of the aluminum oxide layer in the laminate body after bonding is 15 nm. In another example, a 5 nm thick aluminum oxide may be formed on each substrate. In this case, the thickness of the aluminum oxide layer in the laminate body after bonding is 10 m. The thickness of the aluminum oxide layer on each substrate may be reduced by surface activation treatment. For example, a surface activation treatment is performed on aluminum oxide formed to a thickness of 7.5 nm, and the same thickness may become 5 nm. However, the present disclosure is not limited to the above description for the sputtering mechanism, the state of the sputtered particles 107 from the target 106 to the substrates 102,103.

After forming the aluminum oxide film, the surface activation treatment may be performed (FIG. 1(b)), it may be exposed to ambient air and subjected to bonding (FIG. 1(c)), or it may be exposed to ambient air and subjected to bonding without a surface activation treatment (FIG. 1(c)). Hereinafter, description will be given in the order of the drawings.

As shown in FIG. 1(b), as a surface activation treatment, the particle beam source 105 was rotated about the rotational axis 105A, fixed at a position facing the first substrate 102 or the second substrate 103, and the same particle beam source 105 may be used at a supply rate of argon gas of 70 sccm, driven at 1.3 kV, 400 mA, to irradiate the surface of the aluminum oxide film 107,108 formed on the substrate 102,103 with an energy particle beam 105C. For performing the surface activation treatment only on a predetermined region on the substrate, a mask defining the predetermined region is disposed on the substrate.

As shown in FIG. 1(c), the substrate support 104, as a bonding means, is configured to have a rotational axis 104A provided between the portion for supporting the first substrate 102 and the second substrate 103. The substrate support 104 is configured to be folded such that the first substrate 102 and the second substrate 103 face each other around the rotational axis 104A. Thus, as shown in FIG. 1(c), the first substrate 102 and the second substrate 103 are brought into contact with each other by using a simple configuration, and the same pressure can be applied uniformly over almost the entire area to each other. At the time of bonding, a pressurizing means (not shown) for applying a predetermined force from the outside of the folded substrate support 104 may be disposed so as to press the first substrate 102 and the second substrate 103 against each other. In the present example, the vent valve of the vacuum chamber 101 was opened, ambient air was introduced into the vacuum chamber 101, and thereafter they were brought into contact with each other via the aluminum oxide thin films formed on both substrates. After the contact, a force of 5 kN was applied perpendicular to the interface for 5 minutes. In addition, heating means (not shown) may be disposed for heating the first substrate 102 and the second substrate 103 at a predetermined temperature within a range that does not deteriorate the material of the substrate or the function of the electronic element at the time of bonding.

A pressurizing means (not shown) may be disposed for applying a predetermined force from the outside of the folded substrate support 104 so as to press the first substrate 102 and the second substrate 103 against each other, after the bonding. In addition, a heating means (not shown) may be disposed for heating at a predetermined temperature within a range that does not deteriorate the functions of the materials and the electronic elements included in the substrates 102,103 and the metal oxides 107,108, at the time of bonding.

<Heat Treatment>

As described above, the substrate laminate body formed by bonding substrates was further heated at 100° C., 150° C., 200° C., and 300° C. for 1 hour. It was confirmed that the bonding strength after the heating generally increased compared with the bonding strength without heating. The atmosphere in the heat treatment may be ambient air and may be an inert gas such as nitrogen or argon.

The strength of the bonding interface was measured by the blade insertion method. The blade insertion method is a technique in which a blade is inserted between two bonded substrates to peel the substrates, and the interface energy is evaluated from the length from the blade edge to the peeling point as the bonding strength, and it is used for the evaluation of the bonding strength of wafer bonding.

Figure 2:
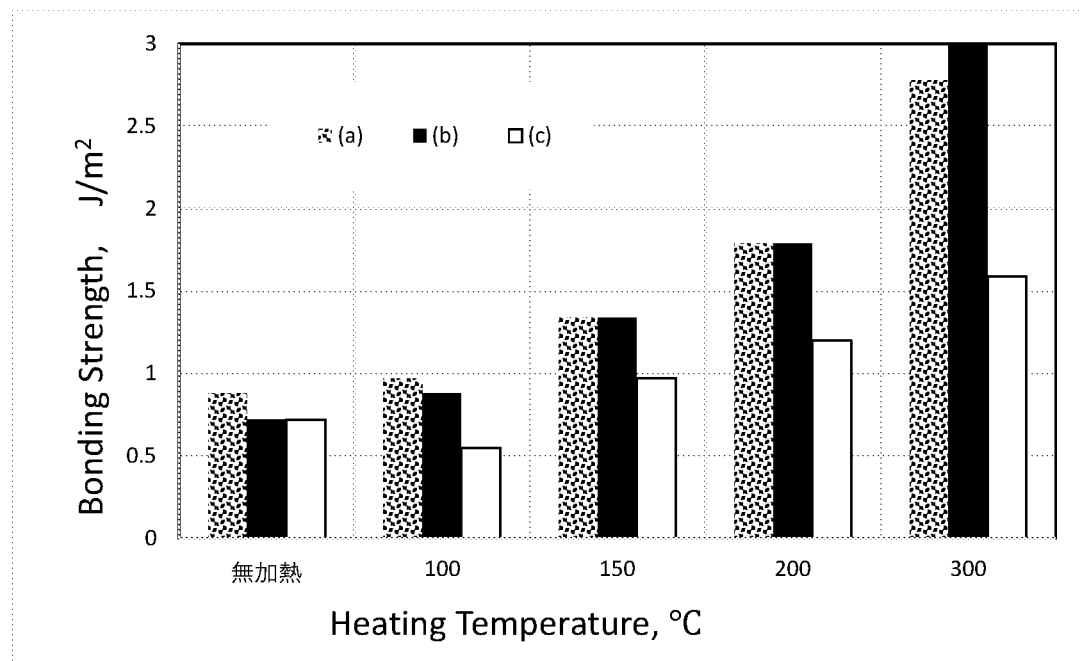
FIG. 2 shows a graph showing the bonding strength.

FIG. 2 shows bonding interface strengths of bonded laminate bodies, with no heating and respective heat treatments in case (a) after the aluminum oxide film was formed, the surface activation treatment was performed, they were exposed to ambient air and bonded, case (b) after the aluminum oxide film was formed, the surface activation treatment was not performed, they were exposed to ambient air and bonded, and case (c) without forming an aluminum oxide film, without performing the surface activation treatment, they were bonded.

In both (a) and (b), the bonding strengths were higher than the control (c). The higher the heating temperature, the greater the difference in bonding strength between (a) and (b), and (c).

In both (a) and (b), the higher the heating temperature, the higher the bonding strength. It was close to 1 $J/m^2$ at the heating temperature of 100° C. In this example, the heating time was 1 hour, but the bonding strength can exceed 1 $J/m^2$ by extending the heating time at the same temperature, further extending the heating time even when the heating temperature is less than 100° C., for example, 80° C., or adjusting other experimental conditions. In both (a) and (b) it exceeded 1 $J/m^2$ at 150° C. and reached 1.8 $J/m^2$ at 200° C. At 300° C., in (a) it reached 2.8 $J/m^2$ while in (b) the base metal fractured before the interface fracture, and thus it was found that a strong bonding interface was formed. Thus, after the heating, a bonding strength equal to or greater than 1 $J/m^2$, 1.5 $J/m^2$, 2 $J/m^2$ or the like can be obtained. Furthermore, by adjusting the experimental conditions, a very high or a desired bonding strength can be obtained.

In the heating test, for the so-called hydrophilic bonding of glass substrates, a large number of voids are likely to be generated at the bonding interface. On the other hand, in the heating test in the present disclosure, little formation of voids was observed.

The light transmittance was measured as the visible light transmittance measured by a commercially available visible light transmittance measuring instrument. Generally, it means the ratio of the luminous flux in a visible light region or a wavelength region of about 360 nm to about 760 nm between before and after the transmission. In the present disclosure, the light transmittance measured for two substrates to be bonded superimposed in a state before carrying out the method of forming a laminate body is referred to as the pre-bonding light transmittance, the light transmittance measured for the laminate body after carrying out the substrate bonding method is referred to as the post-bonding light transmittance. In the present disclosure, a ratio obtained by dividing the post-bonding light transmittance by the pre-bonding light transmittance is referred to as the light transmittance ratio.

By using any of the techniques according to the present disclosure, a light transmittance ratio (the post-bonding transmittance relative to the pre-bonding transmittance) of 90%, 92%, 93%, 95%, 96%, 97%, 98%, 99%, 99.5%, 99.7% or the like, or higher.

Figure 4:
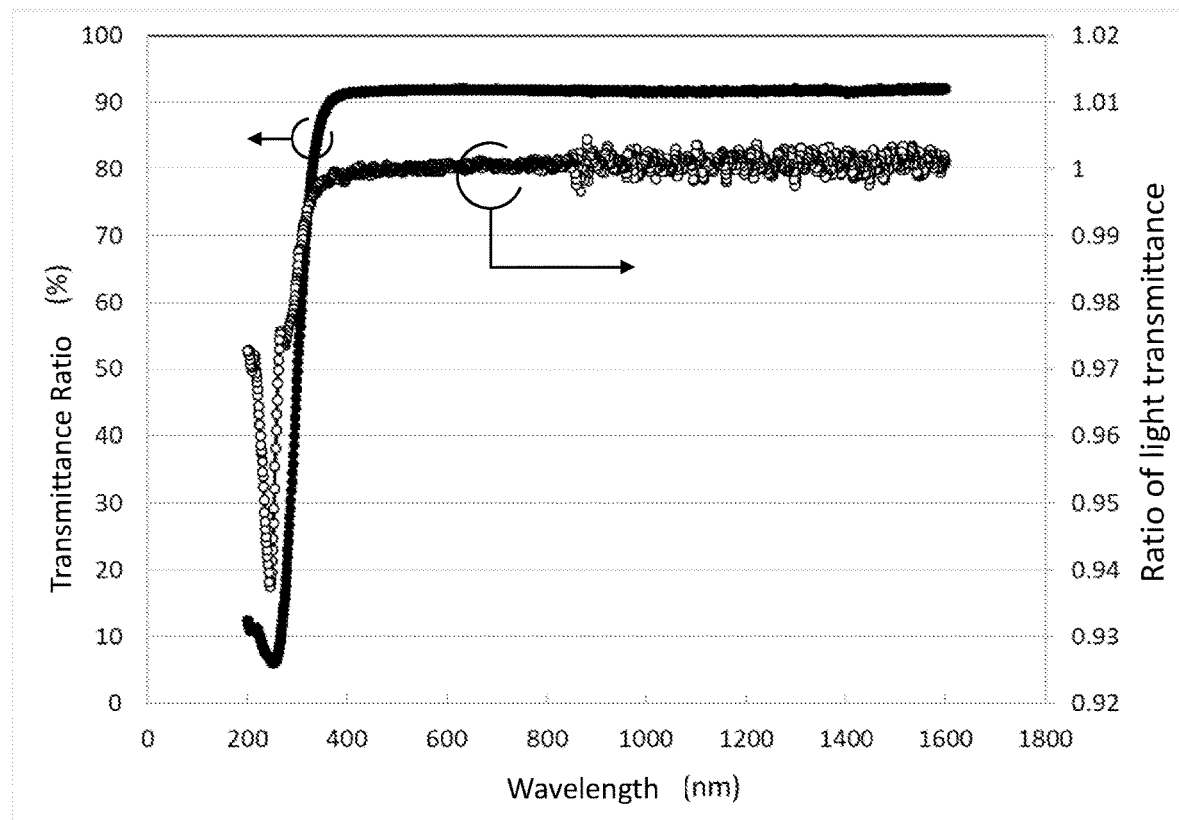
FIG. 4 shows a graph showing the measurement results of the transmittance of the bonded laminate body according to one embodiment.

FIG. 4 shows the light transmittance of the substrate bonded body produced by the bonding method of the above embodiment. The measurements were carried out in the wavelength range from 200 nm to 1600 nm. The transmittance of the two glass substrates before bonding (pre-bonding transmittance) is indicated by black dots and is read on the left vertical axis. The transmittance was low in the ultraviolet region, but exceeded 90% at above about 360 nm, i.e., in the visible light region.

The light transmittance after bonding was substantially the same as the pre-bonding transmittance, so that it could not be distinguished from the graph of the optical transmittance before bonding. FIG. 4 shows the ratio of the light transmittance before and after bonding (light transmittance ratio) as white dots (right vertical axis). At wavelengths of 360 nm or more, the light transmittance ratio was approximately 99.5% or more. Although the light transmittance ratio exceeded 1 partially in a high wavelength region, it may be a variation or error in the measurements. The light transmittance ratio dropped below a wavelength of 360 nm and had a minimum value in the vicinity of a wavelength of 250 nm, but was not lower than 93%. From the above, it has been shown that a transparent substrate laminate body having an extremely high transmittance could be formed in the present example.

The present disclosure includes a transparent substrate laminate body formed by bonding. A layer of an aluminum oxide film or a thin film formed by a sputtering method is sandwiched between a pair of transparent substrates. The substance or layer sandwiched between the transparent substrates may be substantially only an aluminum oxide film formed by a sputtering method, and may substantially consist of an aluminum oxide film formed by a sputtering method.

Since the transparent substrate laminate body included in the present disclosure does not include an organic material such as OCA and consists of only an inorganic material, it can be applied to a range of applications or devices, where a situation is premised in which the use of an organic material is not preferred. The transparent substrate laminate body included in the present disclosure may be used for a transparent panel used in space where the resistance to radiation such as alpha rays is required. The present disclosure includes optoelectronic devices, solar cells, solar cells for space applications, radiation resistant solar cells, radiation resistant optoelectronic devices, having a transparent substrate laminate body. The present disclosure also includes aeronautical apparatuses or aircraft bodies, such as aircrafts, satellites, rockets, space stations, etc., window materials or windows used in architectural applications, pressure-resistant glass, etc., including such a transparent substrate laminate body.

As a method of bonding transparent substrates, a technique is known in which a thin film of metal is formed on a bonding surface of a transparent substrate, substrates are bonded through the thin metal film, and a laser is irradiated on the thin metal film sandwiched between the substrates to absorb the metal in the substrates, and as a result, a substrate laminate body having a relatively high transparency is obtained. However, in this approach, the metal may not be completely absorbed by the substrates, and light transmittance may be problematic. In addition, in electronic display devices such as smartphones, a polymer film including an organic EL element or the like is often bonded to a transparent substrate. But laser heating is not suitable for relatively low-resistance materials and components such as polymer films. On the other hand, the method of forming the laminate body of the present disclosure is suitable also for bonding a polymer film because it is not necessary to inject high energy into the bonding interface. Further, it is not necessary to interpose an OCA, and a laminate body having a high transparency and high adhesion and high transparency can be formed.

The substrate to be bonded may be flat or in a plane shape, and may have a non-flat shape.

The substrate to be bonded may be a curved tempered glass substrate and may include a tempered glass having a curved surface. The substrate to be bonded or the laminate body may have a L-shaped cross section, a U-shaped cross section, or an arcuate cross section. These substrates and laminate bodies may be used in electronic display devices, such as three-dimensional shaped smartphones, tablets, and the like, having a display or optical element on a curved or lateral surface.

The other substrate or the second substrate to be bonded may be a flexible substrate and may include a flexible substrate. The flexible substrate may include an optical element.

OCA is weak against bending, and it is difficult to use for substrates with a large curvature. The method of bonding a substrate of the present disclosure can avoid the use of OCA, and directly attaches a cover glass and a functional film such as a deflection film via a metal oxide film, thereby making it possible to form a laminate body having a high transparency while solving the above-mentioned drawbacks.

In yet another embodiment, both of the pair of substrates to be bonded may be glass substrates, one or the first substrate may be a glass substrate, and the second substrate may be a glass substrate having a bonding area smaller than the first substrate. In still further embodiments, the second substrate may be a glass substrate having a frame shape or a frame shape along an edge of the first substrate. The second substrate may also be bonded to a portion of the edge of the first substrate. For example, the first substrate may be a generally rectangular planar glass substrate and the second substrate may be bonded along an opposing pair of sides of the first substrate. In this case, the second substrate may include a plurality of substrates. All glass substrates in the present disclosure may be made of reinforced glass and may be a substrate comprising reinforced glass.

The method of bonding substrates included in the present disclosure may further include: the first substrate is a glass substrate or a substrate including a glass substrate; the second substrate is a substrate having a bonding surface bonded to a part or the whole of an edge of the first substrate; and after the first substrate and the second substrate are bonded to each other, the bonded first substrate and the second substrate are machined to form a curved glass substrate.

Alternatively, the method of bonding substrates included in the present disclosure may include machining the first substrate and the second substrate that are bonded to each other, to form a curved surface on at least a part of the first substrate and the second substrate. The machining may include at least one of a grinding process and a polishing process. The machining may be performed in a manner that avoids a bending process. Since a general tempered glass is weak against bending and its bending is difficult, there is a problem that the bent tempered glass becomes expensive. On the other hand, according to the above method, this problem can be solved, and a curved glass substrate or a curved reinforced glass substrate having a desired curved surface shape can be formed without bending or deformation at a high temperature.

Figure 3:
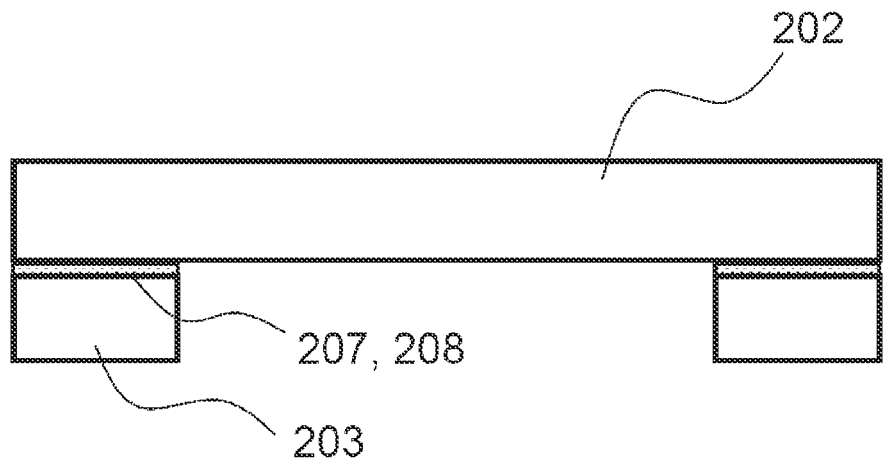
FIG. 3 shows a schematic cross-sectional view showing each step of the formation method of the laminate body according to an embodiment.
Figure 3:
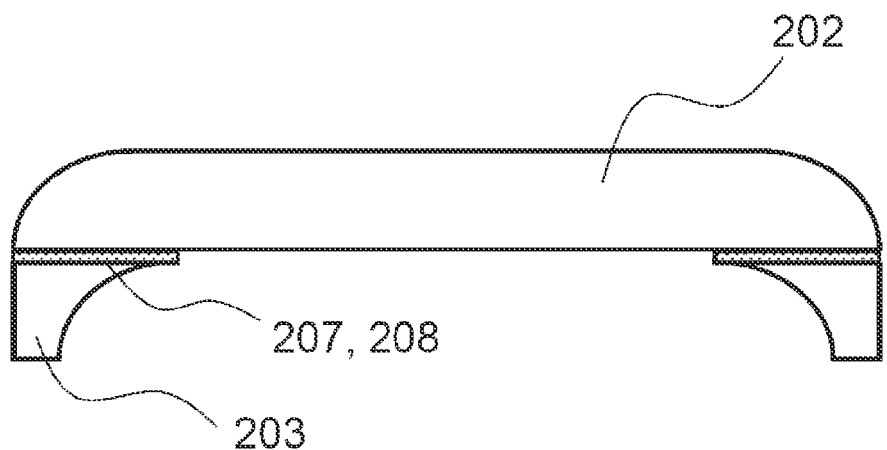
Figure 3:
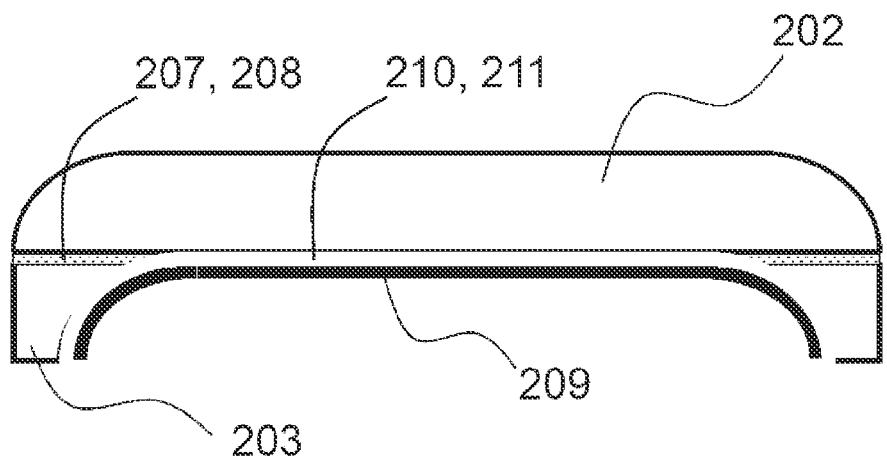

In a further embodiment, the substrate bonding method includes: forming first metal oxide thin films 207,208 on the bonding surface of the first substrate 202 and the first bonding surface of the second substrate 203; performing a first activation treatment on the surfaces of the first metal oxide thin films 207,208 on the bonding surface of the first substrate 202 and the first bonding surface of the second substrate 203; contacting the bonding surface of the first substrate 202 and the first bonding surface of the second substrate 203 with each other via the metal oxide thin films 207,208, to bond the first substrate 202 and the second substrate 203; forming second metal oxide thin films 210, 211 on the second bonding surface of the second substrate 203 and the bonding surface of the third substrate 209; performing a second activation treatment on the surfaces of the second metal oxide thin films 210, 211 on the second bonding surface of the second substrate 203 and the second bonding surface of the third substrate 209; and contacting the second bonding surface of the second substrate 202 and the bonding surface of the third substrate 209 with each other via the second metal oxide thin films 210, 211, to bond the second substrate 203 and the third substrate 209. (FIG. 3)

In the method of bonding substrates, the third substrate 209 may be bonded to the first substrate 202. The third substrate 209 may be bonded to the first substrate 202 and the second substrate 203. That is, the method may include contacting the bonding surface of the third substrate 209 to the second bonding surface of the first substrate 202 and the second bonding surface of the second substrate 203, to bond the first substrate 201 and the second substrate 203 to the third substrate 209.

The first substrate 202 and the second substrate 203 may be transparent substrates, substrates of tempered glass, or substrates including tempered glass. In yet another embodiment, the third substrate may be a flexible substrate. As described above, it is difficult to bend a flat reinforced glass, or a bent reinforced glass is expensive. Therefore, it is possible to produce an electronic display device which is cheaper and has a high light extraction efficiency.

The present disclosure also includes electronic or optoelectronic or optical devices, or generally devices, manufactured by methods including any of the substrate bonding methods disclosed in this application. In some embodiments, the device may comprise a laminate body manufactured in a method comprising any of the substrate bonding methods of the present disclosure. In a further embodiment, the device may comprise an organic EL element. In still further embodiments, the device may be a smart phone, a display device, a solar cell, a SAW filter device, and may be a building material such as a window, a pressure-resistant glass, and the like.

The present disclosure includes the following embodiments:

A01
A method for bonding transparent substrates, comprising:
preparing a pair of transparent substrates;
forming a thin film of aluminum oxide by a sputtering method, on a bonding surface of the transparent substrates;
contacting the aluminum oxide thin films in the air to bond the pair of transparent substrates; and
heating the bonded pair of transparent substrates.

A02
The method according to Embodiment A01,
wherein said forming the thin film of aluminum oxide by the sputtering method includes irradiating an aluminum target with energy of a noble gas and an oxygen gas.

A03
The method according to Embodiment A02,
wherein the noble gas includes argon gas.

A04
The method according to any one of Embodiments A01 to A03,
wherein the heating includes heating at a temperature of 80 degrees Celsius or higher, and lower than 550 degrees Celsius.

A05
The method according to Embodiment A04,
wherein the heating includes heating at a temperature of 150 degrees Celsius or higher.

A06
The method according to Embodiment A05,
wherein the heating includes heating at temperature of 200 degrees Celsius or higher.

A07
The method according to Embodiment A06,
wherein the heating includes heating at a temperature of 300 degrees Celsius or higher.

A08
The method of any one of Embodiments A04 to A07,
wherein the heating includes heating for 10 minutes or longer.

A09
The method according to any one of Embodiments A01 to A08,
wherein forming the aluminum oxide thin film, the pair of transparent substrates are bonded, after forming the aluminum oxide thin film, without performing an activation treatment with respect to the bonding surface of the transparent substrate or the surface of the aluminum oxide thin film.

A10
The method of any one of Embodiments A01 to A08,
further comprising performing an activation treatment on the surface of the formed aluminum oxide thin film.

A11
The method according to any one of Embodiments A01 to A10,
wherein the bonding strength after the heating is 1.5 J/m$^2$ or greater.

A12
The method according to Embodiment A11,
wherein the bonding strength after the heating is 2 J/m$^2$ or greater.

A13
The method according to any one of Embodiments A01 to A12,
wherein the transmittance of the bonded substrates after the heating is 93% or greater of the transmittance of the substrates before the bonding.

A14
The method according to Embodiment A13,
wherein the transmittance of the bonded substrates after the heating is 99% or greater of the transmittance of the substrate before the bonding.

A15
The method according to Embodiment A14,
wherein the transmittance of the bonded substrates after the heating is 99.5% or greater of the transmittance of the substrate before the bonding.

B01
A transparent substrate laminate body/laminated transparent substrate, comprising
a pair of transparent substrates; and
an aluminum oxide thin film formed by a sputtering method, between the pair of transparent substrates.

B02

The transparent substrate laminate body according to Embodiment B01,
wherein the bonding strength of the transparent substrate laminate body is 1.5 J/m² or greater.

B03

The transparent substrate laminate body according to Embodiment B02,
wherein the bonding strength of the transparent substrate laminate body is 2 J/m² or greater.

B04

The transparent substrate laminate body according to any one of Embodiments B01 to B03,
wherein the transmittance of the transparent substrate laminate body is 93% or greater of the transmittance of the transparent substrates themselves.

B05

The transparent substrate laminate body according to Embodiment B04,
wherein the transmittance of the transparent substrate laminate body is 99% or greater of the transmittance of the transparent substrates themselves.

B06

The transparent substrate laminate body according to Embodiment B05,
wherein the transmittance of the transparent substrate laminate body is 99.5% or greater of the transmittance of the transparent substrates themselves.

While several embodiments and examples of the present invention have been described above, these embodiments and examples illustrate the present invention. It is intended that the appended claims cover numerous modifications to the embodiments without departing from the spirit and scope of the invention. Accordingly, the embodiments and examples disclosed herein have been shown by way of illustration and should not be considered as limiting the scope of the present invention.

The invention claimed is:

1. A method for bonding transparent substrates,
preparing a pair of transparent substrates;
forming a thin film of aluminum oxide by a sputtering method, on a bonding surface of the transparent substrates;
contacting the aluminum oxide thin films in the air to bond the pair of transparent substrates; and
after the pair of transparent substrates are bonded, heating the bonded pair of transparent substrates.

2. The method according to claim 1,
wherein said forming the thin film of aluminum oxide by the sputtering method includes irradiating an aluminum target with energy of a noble gas and an oxygen gas.

3. The method according to claim 2,
wherein the noble gas includes argon gas.

4. The method according to claim 1,
wherein the heating includes heating at a temperature of 80 degrees Celsius or higher, and lower than 550 degrees Celsius.

5. The method according to claim 4,
wherein the heating includes heating at a temperature of 150 degrees Celsius of higher.

6. The method according to claim 5,
wherein the heating includes heating at temperature of 200 degrees Celsius or higher.

7. The method according to claim 1,
wherein the heating includes heating at a temperature of 300 degrees Celsius or lower.

8. The method of claim 4,
wherein the heating includes heating for 10 minutes or longer.

9. The method according to claim 1,
wherein the pair of transparent substrates are bonded, after forming the aluminum oxide thin film, without performing an activation treatment with respect to the bonding surface of the transparent substrate or the surface of the aluminum oxide thin film.

10. The method of claim 1,
further comprising performing an activation treatment on the surface of the formed aluminum oxide thin film.

11. The method according to claim 1,
wherein, after the heating, a bonding strength between the transparent substrates is increased to 1.5 J/m² or greater.

12. The method according to claim 11,
wherein, after the heating, a bonding strength between the transparent substrates is increased to 2 J/m² or greater.

13. The method according to claim 1,
wherein the transmittance of the bonded substrates after the heating is 93% or greater of the transmittance of the substrates before the bonding.

14. The method according to claim 13,
wherein the transmittance of the bonded substrates after the heating is 99% or greater of the transmittance of the substrate before the bonding.

15. The method according to claim 1,
wherein the heating the bonded pair of transparent substrates is not via laser.

16. The method according to claim 1,
wherein the contacting the aluminum oxide thin films in the air to bond the pair of transparent substrates comprises contacting the aluminum oxide thin films in the air with 5 kN of force to bond the pair of transparent substrates.

17. The method according to claim 1,
wherein the contacting the aluminum oxide thin films in the air to bond the pair of transparent substrates comprises contacting the aluminum oxide thin films in the air under atmospheric pressure for at least 30 minutes to bond the pair of transparent substrates.

18. The method according to claim 1,
wherein, after the heating, a bonding strength between the transparent substrates is increased to 1 J/m² or greater.

* * * * *